United States Patent [19]

Schlegel et al.

[11] 4,270,135
[45] May 26, 1981

[54] HIGH-FREQUENCY PHOTOTRANSISTOR OPERATED WITH MULTIPLE LIGHT SOURCES

[75] Inventors: Earl S. Schlegel, Plum Borough; Maurice H. Hanes, Murrysville, both of Pa.

[73] Assignee: Westinghouse Electric Corp., Pittsburgh, Pa.

[21] Appl. No.: 103,129

[22] Filed: Dec. 13, 1979

[51] Int. Cl.³ .............................................. H01L 31/12
[52] U.S. Cl. .......................................... 357/19; 357/30; 357/17; 357/18; 307/311; 307/260; 331/94.5 H
[58] Field of Search ..................... 357/19, 18, 30, 17; 331/94.5 H; 307/311, 260

[56] References Cited

U.S. PATENT DOCUMENTS

| | | | |
|---|---|---|---|
| 3,920,495 | 11/1975 | Roberts | 156/8 |
| 4,131,905 | 12/1978 | Hanes | 357/30 |
| 4,181,901 | 1/1980 | Heyke | 331/94 SH |
| 4,194,162 | 3/1980 | Uematsu | 330/4.3 |
| 4,212,024 | 7/1980 | Sugawara | 357/38 |

Primary Examiner—Martin H. Edlow
Attorney, Agent, or Firm—C. L. Menzemer

[57] ABSTRACT

A photo-transistor includes a multi-apertured collector electrode disposed on a semiconductor collector layer. A laser diode and a light pipe are provided for each aperture such that the light from the laser is transmitted to its associated aperture via the light pipe. Means are included for sequentially pulsing each laser so as to cause a high-frequency intermittent current in the photo-transistor piece of molybdenum 88 which provides improved current flow and heat sinking for the transistor 10.

9 Claims, 4 Drawing Figures

4,270,135

HIGH-FREQUENCY PHOTOTRANSISTOR OPERATED WITH MULTIPLE LIGHT SOURCES

BACKGROUND OF THE INVENTION

1. Field of the Invention

The present invention relates to photo responsive semiconductor devices, and in particular to photo transistors having multi-apertured collector electrodes.

2. Description of the Prior Art

The frequency response of bipolar photo-transistors is largely limited by the product of base resistance and emitter capacitance. Bipolar phototransistors have largely been designed for low speed, low power operation where a high base resistance is not a problem. Some prior art high frequency photo-transistor designs have attempted to reduce the base resistance, as by interdigitating the emitter and base, but have not been able to achieve the desired frequency response.

One method for increasing the frequency response of bipolar phototransistors involves forming apertures or openings in the collector electrode for admitting light therethrough in order to generate carriers close to the base-collector junction. Current carriers are instantly subjected to the high space-charge field surrounding the depletion region and, thus, fast turn-on can be achieved by a rapid rise-time light pulse. However, the power-frequency capabilities of the apertured collector configuration is limited by the power-frequency capabilities of available light sources. That is, for example, where high power laser diodes are used as a light source for firing an apertured collector photo-transistor, a frequency vs. power trade-off is required for the laser diode. The more power required from the laser diode, the lower the possible repetition rate or frequency. Or, conversely, the higher the frequency desired from the laser diode, the lower the possible power from the laser diode.

SUMMARY OF THE INVENTION

According to the present invention, a photo-responsive semiconductor device is provided comprising a body of semiconductor material upon which is disposed a multi-apertured electrode. Means coupled to the apertures are provided for admitting electromagnetic radiation through each aperture in arbitrary sequence for intermittently creating an electrical current in said body of semiconductor material. In another embodiment, means are included for admitting electromagnetic radiation through each aperture in a predetermined sequence.

More particularly, a phototransistor having a semiconductor emitter, a semiconductor base, and a semiconductor collector also includes an emitter electrode disposed on the semiconductor emitter and a multi-apertured collector electrode disposed on the semiconductor collector. A laser diode is coupled to each of the apertures in the collector electrode through a fiber optics cable or light pipe. Each of the laser diodes is fired in a sequence, arbitrary or predetermined, until all of the apertures have been exposed to the laser light only a single time. When an aperture is exposed to the laser light, an electrical current is created in the transistor semiconductor portion until the laser light is removed. By sequentially exposing and removing laser light from each aperture, intermittent current having a high frequency is created in the transistor.

DESCRIPTION OF THE PREFERRED EMBODIMENT

Figure 1:
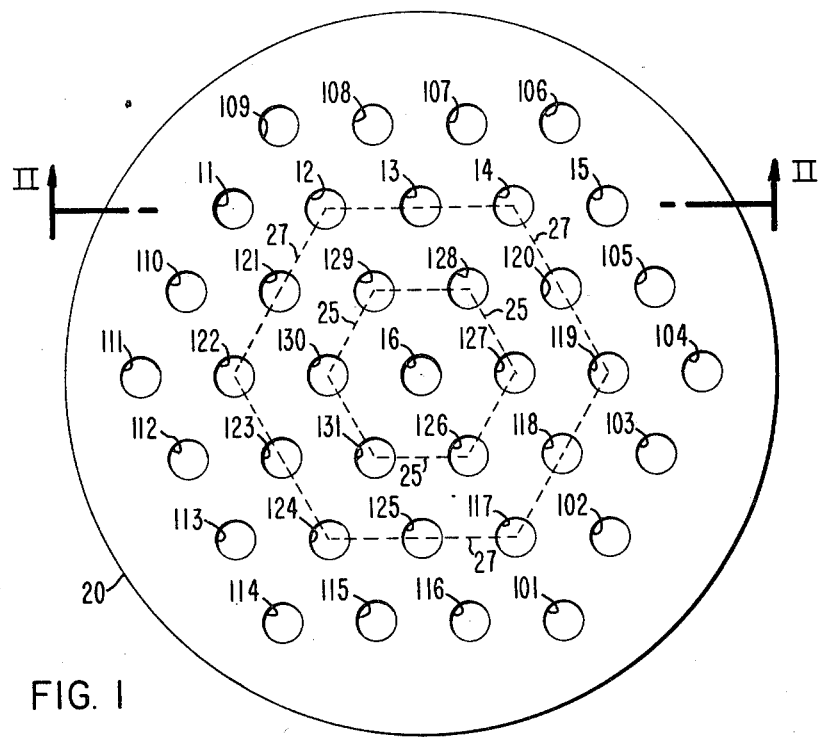
FIG. 1 shows a surface view of a phototransistor according to the teachings of the present invention.

FIG. 1 is a top view of a transistor 10 according to the teachings of the present invention. Observable in this top view is a circular collector electrode 20 through which are created a plurality of apertures, for example, apertures 11, 12, 13, 14 and 15. The apertures of FIG. 1 are each approximately 50 mils in diameter. A center aperture 16 is located in the middle of the electrode 20 and the other apertures, for example, apertures 11 through 15, are spaced so as to surround the center aperture 16 in a hexagonal array, that is such that lines forming concentric hexagons can be drawn through the centers of the apertures surrounding the center aperture 16. For example, the dashed lines 25 and 27 drawn through the centers of certain apertures in FIG. 1 form concentric hexagons. Dashed line 25 connects the centers of apertures 126, 127, 128 129, 130, and 131. And, dashed line 27 connects the centers of apertures 117, 118, 119, 120, 121, 122, 123, 124, and 125. The apertures of the electrode are spaced apart such that the distance between the centers (center-to-center) of two apertures on the same side of the same hexagon is approximately 100 mils. For example, the distance between the centers of apertures 12 and 13 is 100 mils. Normally, the collector electrode 20 contains at least 7 apertures (center aperture 16 plus the 6 apertures connected by the hexagon formed by the dashed line 25) and may contain as many as 91 apertures, but preferably contains 37 apertures (the center aperture 16 plus 3 concentric hexagons).

Figure 2:
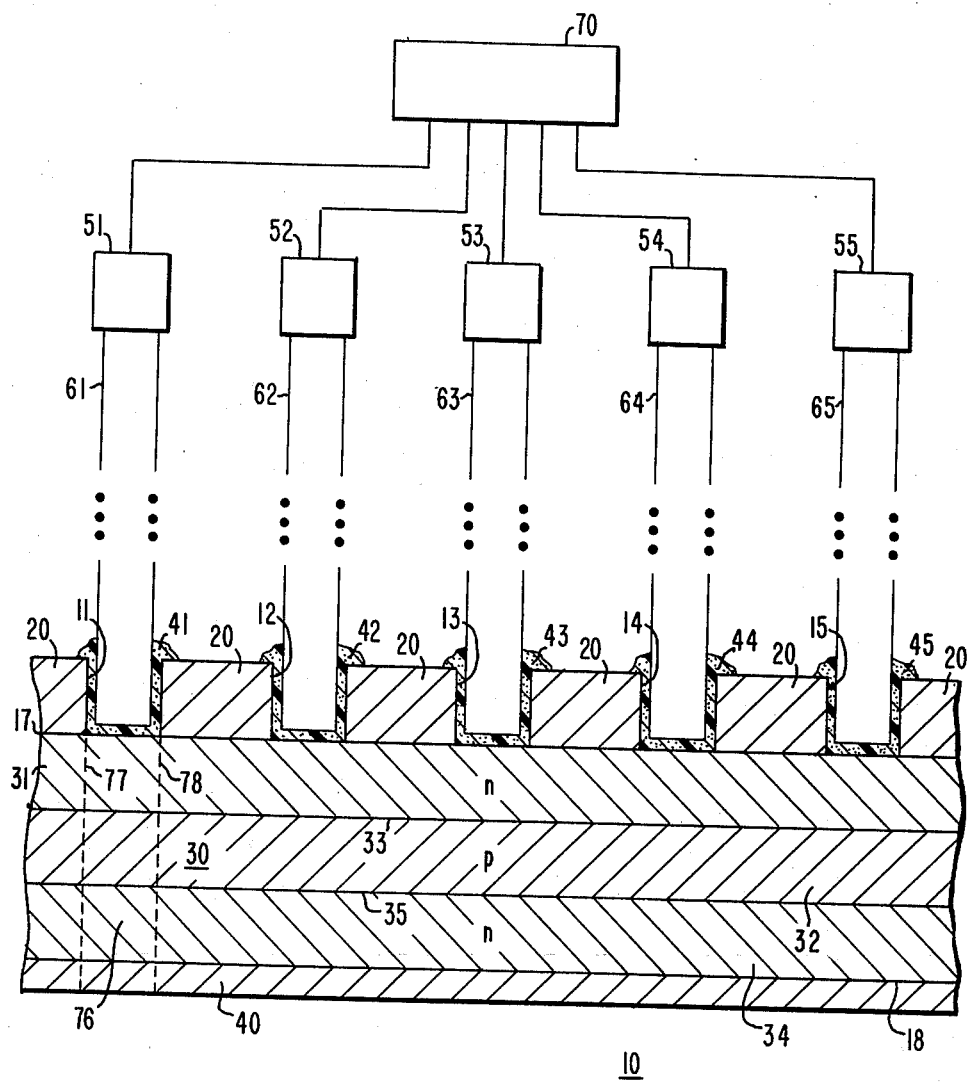
FIG. 2 is a sectional view of the phototransistor of FIG. 1 including laser and light pipe connections.

FIG. 2 shows a sectional view of the transistor 10 of FIG. 1 along the lines II—II. In addition to the collector electrode 20 and the apertures 11 through 15, the transistor 10 includes a body 30 of semiconductor material and an emitter electrode 40. The body 30 of semiconductor material incudes top and bottom surfaces 17 and 18, respectively, between which surfaces 17 and 18 is a n-type collector layer 31 and a p-type base layer 32 disposed adjacent to each other so as to form a p-n junction 33. A n-type emitter layer 34 is disposed adjacent to the bottom surface 18 and adjacent to the base layer 32 so as to form a p-n junction 35 therewith.

According to the teachings of the present invention, a source of electromagnetic energy is coupled to each of the apertures in the collector electrode 20. For example, in FIG. 2, laser diodes 51, 52, 53, 54 and 55 are coupled, respectively, to apertures 11, 12, 13, 14 and 15 by optic fiber bundles or light pipes 61, 62, 63, 64 and 65, respectively, each of which light pipes is on the order of 0.005" to 0.050" in diameter. Each of the laser diodes 51 through 55 is preferably characterized by a light having an energy of 1 microjoule per pulse for a 100 nanosecond pulse width and a wave length of 0.904 microns ($\mu$m). By way of example, each of the laser diodes 51 through 55 can be of a type similar to the laser diode design manufactured by RCA, part number SG3001.

Also, by way of example, each of the fiber optic bundles or light pipes 61 through 65 can be of a type similar to the 1.1 mm fiber optics cable manufactured by Galileo, part number K2K. One end of each light pipe, for example, light pipes 61 through 65, is coupled to its respective laser source in a conventional manner, for example, with a fiber optics connector. The other end of each light pipe, for example, light pipes 61 through 65, is dipped in epoxy and inserted through its respective aperture so as to be within approximately 0–10 mils of the top surface 17. The epoxy, for example, the stippled areas at 41, 42, 43, 44 and 45, serves as a sealant and serves to anchor each light pipe into position.

Sequencing means 70 is provided for pulsing in the laser diodes coupled to the transistor 10 in the desired sequence. The sequencing means 70 can be a microprocessor, for example.

Figure 3:
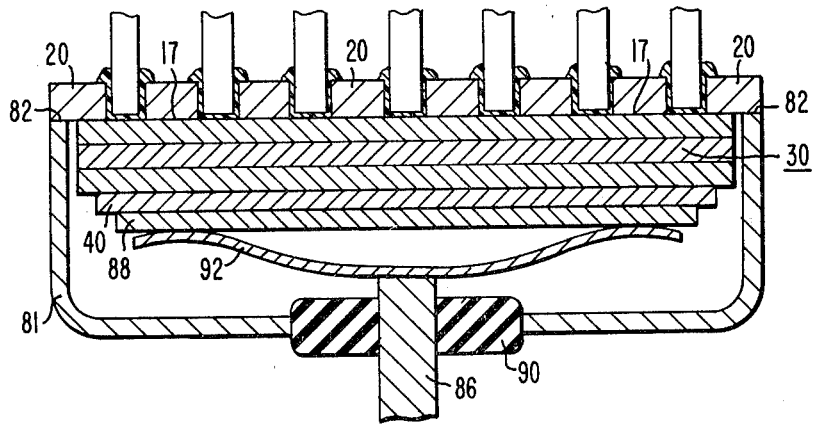
FIG. 3 shows timing diagrams for operating the transistor of FIGS. 1 and 2.

A cross-section of an integrated packaging structure is shown in FIG. 3 including the semiconductor body 30, the collector electrode 20, and the emitter electrode 40. The collector electrode 20 extends radially for a distance off the surface 17 and is welded to the top of a metal can 81 at a point 82. The metal can 81 is approximately bowl-shaped, is approximately ¼" deep, 1" in diameter, and is characterized by a circular opening in the center of its bottom. A body 90 of insulating material covers the opening in the bottom of the metal can 81 and an emitter lead 86 is inserted in the center of the body of insulating material 90. The emitter lead 86 is coupled to a formed piece of metal 92 serving to apply a spring tension to a molybdenum disc 88 contacing the emitter electrode 40. The molybdenum disc 88 serves to provide improved current flow and heat sinking for the transistor 10.

Figure 4:
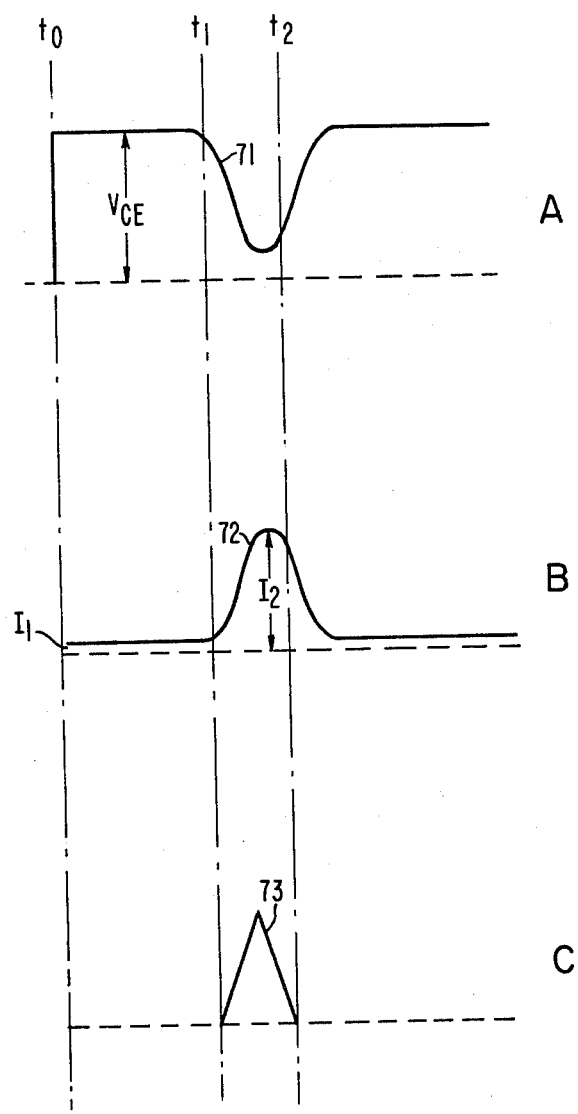
FIG. 4 is a sectional view of the packaging suitable for the phototransistor of FIGS. 1 and 2.

In explaining the operation of the transistor 10, the timing diagrams 4A, B4, and 4C of FIG. 4 will be used. A curve 71 of FIG. 4A represents the voltage impressed across the electrodes 20 and 40 and a curve 72 of FIG. 4B represents the current in the semiconductor body 30 for one pulsing sequence. At a time $t_o$ a voltage $V_{CE}$ of approximately 100 V to 1000 V as shown by the curve 71 at time $t_o$ in FIG. 4A is impressed across the electrodes 20 and 40. At this time the transistor is OFF, that is, only nominal current $I_1$ is flowing therethrough as shown by the curve 72 at time $t_o$ in FIG. 4B. From a time $t_1$ to a time $t_2$, one of the apertures is exposed to electromagnetic radiation, for example, referring to FIG. 2, the aperture 11 is exposed to a pulse of light from the laser diode 51 through the fiber optic bundle or light pipe 61 creating carriers (current) in or near a depletion layer at the collector junction 23. The pulse of light emitted by the laser diode 51 can be characterized by a curve 73 during time $t_1$-$t_2$ in FIG. 4C. This action in a conventional, well-known manner results in the injecting of electrons from the emitter into the base and a current $I_2$ flows as shown by the curve 72 at time $t_1$-$t_2$ in FIG. 4B. The current $I_2$ has a magnitude which is a multiple (as determined by the transistor gain (G)) of the magnitude of the current generated in the collector by laser light 51 and flows in the body 30 of semiconductor material substantially confined in a current carrying region 76 bounded by the dashed lines 77 and 78.

The pulse of light emitted by the laser diode 51, as described hereinbefore, is a short, high energy pulse of light approximately 100 ns (nanoseconds) in duration and approximately 1 microjoule in energy. The pulse represented by the curve 73 in FIG. 4C causes a short pulse of current of high magnitude in the semiconductor body 30 of FIG. 2.

At the time $t_3$, slightly more than 100 ns after the time $t_1$, the current in the photo-transistor 10 returns to the level of $I_1$ and the voltage across the electrodes 20 and 40 returns to the level of $V_{CE}$ as shown at time $t_3$ in FIGS. 4B and 4A, respectively. The curve 71 is substantially the inverse of the curve 72, assuming that there is a resistive load in an external circuit.

After the laser diode 51 has been pulsed, other of the laser diodes are pulsed in either an arbitrary sequence or a predetermined sequence so as to pulse every laser a single time before preferably returning to the laser diode 51. Or, if the sequence is arbitrary, the second cycle may begin by pulsing a laser diode other than the laser diode 51. However, it is preferable to begin each sequence cycle with the same laser diode so as to allow the maximum time in which the current-carrying region associated with the exposed aperture can cool off. In addition, where the sequence is predetermined, care should be taken so that a sequence is determined so as to avoid over-heating areas of the transistor, for instance, by firing adjacent laser diodes sequentially, i.e., one after another.

An example of a suitable sequence of the firing of the lasers is a sequence where the apertures of FIG. 1 are exposed to pulses of laser light in the following order: 16, 108, 126, 107, 123, 11, 127, 112, 13, 122, 104, 131, 120, 115, 130, 114, 103, 110, 14, 113, 128, 111, 119, 109, 125, 106, 129, 118, 124, 101, 12, 102, 15, 117, 121, 116 and 105.

Since the base current resulting from the incidence of the laser light 51 upon the collector layer 31 flows axially in the base 32, the transistor gain is not limited by emitter crowding. Moreover, each of the local current-carrying regions, for example, the current-carrying region 76 between the dashed lines 77 and 78, can be subjected to higher-than-conventional current densities since it need carry current only a short period of time per sequence cycle. A particular benefit of the present invention is that the transistor 10 can be fired "hard", that is, fired with high laser energy intensity, at a high frequency thereby avoiding the conventional intensity-frequency trade-offs of laser diodes and other laser energy souces.

While the invention has been described in its preferred embodiment, it is to be understood that the words which have been used are words of description and are not words of limitation and that changes may be made within the purview of the appended claims without departing from the true scope and spirit of the invention in its broader aspects. It will be appreciated by those skilled in the art that the present invention may be practiced in various ways and may take various forms and embodiments other than the illustrative embodiments heretofore described. For example, the number of apertures can be more than 91 and fewer than 7 though admittedly no fewer than 2 according to the teachings of the present invention. Also, the predetermined firing sequence described heretofore is by way of example only as a preferred optimal sequence and is not to be taken as a limitation on the teachings of the present invention. Other non-optimal sequences may be used and continue to be within the scope and spirit of the teachings herein. Also, the teachings of the present invention are intended to cover the firing of any semiconductor device or any semiconductor material suitable to being fired by electromagnetic energy or radiation. Indeed, the invention is intended to cover the firing of semiconductor devices within the aforementioned scope by any means of electromagnetic energy, not just laser diodes.

Since still other structural variations are possible, it is to be understood that the scope of the invention is not limited by the details of the foregoing description but will be defined in the following claims.

What we claim is:

1. A photo-responsive semiconductor device comprising:
   (1) a body of semiconductor material;
   (2) a first electrode disposed on said body of semiconductor material, said first electrode having two apertures therein; and
   (3) means for admitting electromagnetic radiation through each aperture alternately for intermittently creating an electrical current in said body of semiconductor material.

2. A photo-responsive semiconductor device comprising:
   (1) a body of semiconductor material;
   (2) a first electrode disposed on said body of semiconductor material, said first electrode having a plurality of apertures therein; and
   (3) means for admitting electromagnetic radiation through each aperture in a random sequence for intermittently creating an electrical current in said body of semiconductor material.

3. A photo-responsive semiconductor device for conducting electrical current in response to electromagnetic radiation, said device comprising:
   (1) a body of semiconductor material for supporting said electrical current;
   (2) first and second electrodes disposed on said body of semiconductor material for providing said electrical current to an external circuit, said first electrode having a plurality of apertures therethrough for admitting said electromagnetic radiation; and
   (3) means coupled to said apertures for admitting said electromagnetic radiation therethrough in a arbitrary sequence for intermittently creating an electrical current in said body of semiconductor material.

4. A photo-responsive semiconductor device for conducting electrical current in response to electromagnetic radiation, said device comprising:
   (1) a body of semiconductor material for supporting said electrical current;
   (2) first and second electrodes disposed on said body of semiconductor material for providing said electrical current to an external circuit, said first electrode having a plurality of apertures therethrough for admitting said electromagnetic radiation; and
   (3) means coupled to said apertures for admitting said electromagnetic radiation therethrough in a predetermined sequence for intermittently creating an electrical current in said body of semiconductor material.

5. A photo-responsive semiconductor device according to claim 4 wherein:
   (1) said body of semiconductor material includes first and second surfaces, three adjacently disposed layers of semiconductor material of alternate conductivity type between said first and second surfaces, said three adjacently disposed layers including a collector region adjacent to said first surface, an emitter region adjacent to said second surface, and a base region between said emitter and collector regions; and
   (2) said first electrode is disposed on said first surface, and second electrode is disposed on said second surface.

6. A method for operating a semiconductor device, said semiconductor device including a body of semiconductor material, an electrode disposed on said body of semiconductor material, said electrode having apertures therethrough for admitting electromagnetic radiation, and means coupled to said apertures for emitting electromagnetic radiation, said method comprising the step of:
   (1) admitting said electromagnetic radiation through each of said apertures in an arbitrary sequence until all of the apertures have been exposed to said electromagnetic radiation a single time in order to intermittently create an electrical current in said body of semiconductor material; and
   (2) admitting said electromagnetic radiation through each of said apertures in an arbitrary sequence until all of the apertures have been exposed to said electromagnetic radiation a single time in order to intermittently create an electrical current in said body of semiconductor material.

7. A method for operating a semiconductor device, said semiconductor device including a body of semiconductor material, an electrode disposed on said body of semiconductor material, said electrode having apertures therethrough for admitting electromagnetic radiation, and means coupled to said apertures for emitting electromagnetic radiation, said method comprising the step of:
   (1) admitting said electromagnetic radiation through each of said apertures in a predetermined sequence such that each aperture is exposed to said electromagnetic radiation a single time for intermittently creating an electrical current in said body of semiconductor material; and
   (2) repeating said predetermined sequence.

8. A method for operating a semiconductor device, said semiconductor device including a body of semiconductor material and an electrode disposed on said body of semiconductor material, said electrode having apertures therethrough for admitting electromagnetic radiation, said method comprising the steps of:
   (1) coupling a source of electromagnetic radiation to each of said apertures;
   (2) operating said sources of electromagnetic radiation such that each of said apertures is exposed to said electromagnetic radiation in a random sequence until all of the apertures have been exposed a single time for intermittently creating an electrical current in said body of semiconductor material; and
   (3) operating said sources of electromagnetic radiation such that each of said apertures is exposed to said electromagnetic radiation in an arbitrary sequence until all of the apertures have been exposed a single time for intermittently creating an electrical current in said body of semiconductor material.

9. A method for operating a semiconductor device, said semiconductor device including a body of semiconductor material and an electrode disposed on said body of semiconductor material, said electrode having apertures therethrough for admitting electromagnetic radiation, said method comprising the steps of:

(1) coupling a source of electromagnetic radiation to each of said apertures;
(2) operating said sources of electromagnetic radiation such that each of said apertures is exposed to said electromagnetic radiation in a predetermined sequence such that each of said apertures is exposed to said electromagnetic radiation a single time for intermittently creating an electrical current in said body of semiconductor material;
(3) repeating said predetermined sequence;
(4) regulating the current through the transistor by regulating the intensity of the light from the laser diodes; and
(5) light sources could be light emitting diodes (LED) (which have power) for lower instantaneous current but longer pulses (up to infinitely long for LED's of low power) say 5 microseconds.

* * * * *